United States Patent [19]
Wen et al.

[11] Patent Number: 5,574,302
[45] Date of Patent: Nov. 12, 1996

[54] FIELD EFFECT TRANSISTOR STRUCTURE OF A DIVING CHANNEL DEVICE

[75] Inventors: Jemmy Wen, Hsin-Chu; Water Lur, Taipei; Joe Ko, Hsin-Chu, all of Taiwan

[73] Assignee: United Microelectronics Corporation, Hsin-Chu, Taiwan

[21] Appl. No.: 518,708

[22] Filed: Aug. 24, 1995

Related U.S. Application Data

[62] Division of Ser. No. 365,044, Dec. 27, 1994, Pat. No. 5,460,987.

[51] Int. Cl.$^6$ .......................... H01L 29/76; H01L 29/94; H01L 31/062
[52] U.S. Cl. .......................... 257/330; 257/331; 257/385
[58] Field of Search .................... 257/330, 331, 257/332, 333, 334, 347, 348, 349, 350, 351, 352, 353, 385

[56] References Cited

U.S. PATENT DOCUMENTS

| 5,095,347 | 3/1992 | Kirsch | 257/347 |
| 5,111,260 | 5/1992 | Malhi et al. | 257/347 |
| 5,180,680 | 1/1993 | Yang | 437/38 |
| 5,204,280 | 4/1993 | Dhong et al. | 437/52 |

*Primary Examiner*—Wael M. Fahmy
*Attorney, Agent, or Firm*—William H. Wright

[57] ABSTRACT

This invention describes a diving channel device structure and a method of forming the diving channel device structure using deep vertical trenches formed in a silicon substrate crossing shallow vertical trenches formed in the same silicon substrate. The deep vertical trenches are filled with a first heavily doped polysilicon to form the sources and drains of field effect transistors. The shallow vertical trenches are filled with a second highly doped polysilicon to form the gates of the transistors. The device structure provides reduced drain and source resistance which remains nearly constant when the device is scaled to smaller dimensions. The device structure also provides reduced leakage currents and a plane topography. The device structure forms a large effective channel width when the device is scaled to smaller dimensions.

13 Claims, 3 Drawing Sheets

FIELD EFFECT TRANSISTOR STRUCTURE OF A DIVING CHANNEL DEVICE This application is a divisional of U.S. Pat. No. 08/365,044, filed Dec. 27, 1994 now U.S. Pat. No. 5,460,987.

BACKGROUND OF THE INVENTION

1. Field of the Invention

The invention relates to the use of trenches formed in a semiconductor substrate for the formation of a high density, high performance device structure. Deep trenches filled with polysilicon forming the sources and drains of field effect transistors cross shallow trenches filled with polysilicon forming the gates of the transistors. The devices form an array of field effect transistors in ultra large scale integrated circuits.

2. Description of the Prior Art

In using field effect transistors in the formation of integrated circuits increased density and increased performance has long been recognized as having key importance. In addition it is important to keep the leakage currents and source and drain resistances as low as possible.

This invention uses deep trenches in the semiconductor substrate to form source and drain areas and shallow trenches crossing the deep trenches but insulated from the deep trenches to form the gates of field effect transistors. Source and drain resistances are kept low and are nearly constant when the devices are scaled to smaller dimensions. Leakage currents are reduced when compared to conventional structures. U.S. Pat. No. 5,204,280 to Dhong et al shows a method for lithography for making trenches but for a different purpose than for this invention. U.S. Pat. No. 5,180,680 to Yang shows methods for making ROM (read only memory) within a trench.

SUMMARY OF THE INVENTION

It is a principle object of the invention to provide a novel Metal Oxide Semiconductor Field Effect Transistor, or MOSFET, structure of a Diving Channel Device, or DCD.

It is a further object of the invention to provide a method for forming a novel Metal Oxide Semiconductor Field Effect Transistor, or MOSFET, structure of a Diving Channel Device, or DCD.

These objects are achieved by means of deep vertical trenches with deep walls and deep bottoms formed in a silicon substrate. A layer of isolation oxide is formed on the deep bottoms and lower part of the deep walls of the deep vertical trenches. The deep vertical trenches are then filled with a first heavily doped polysilicon. Shallow vertical trenches with shallow walls and shallow bottoms are then formed so as to cross the deep vertical trenches. The shallow bottoms of the shallow vertical trenches are above the top of the isolation oxide layer formed on the deep walls of the deep vertical trenches. A gate oxide layer is then formed on the shallow walls and shallow bottoms of the shallow vertical trenches. The shallow vertical trenches are then filled with a second heavily doped polysilicon. A gate contact is made to the second heavily doped polysilicon in the shallow vertical trenches. Source and drain contacts are made to the first heavily doped polysilicon in the deep vertical trenches.

The heavily doped first polysilicon in the deep vertical trenches is N type polysilicon for a P type substrate and P type polysilicon for an N type substrate and form the sources and drains of field effect transistors. The polysilicon in the shallow vertical trenches become the gates of field effect transistors. The isolation oxide formed in the deep vertical trenches keeps the leakage currents at the sources and drains extremely low. This structure keeps the source and drain resistances below about 10 ohms per square and very nearly constant as circuits are scaled down to smaller dimensions. This structure also provides higher effective channel width, about two times the shallow trench depth plus the shallow trench width, even when circuits are scaled down to smaller dimensions. The regular array nature of the high density high performance devices make them well suited for use in Static Random Access Memory, Read Only Memory, Electronically Programmable Read Only Memory, Dynamic Random Access Memory, etc. as both cell circuits and peripheral circuits.

DESCRIPTION OF THE PREFERRED EMBODIMENTS

Figure 1:
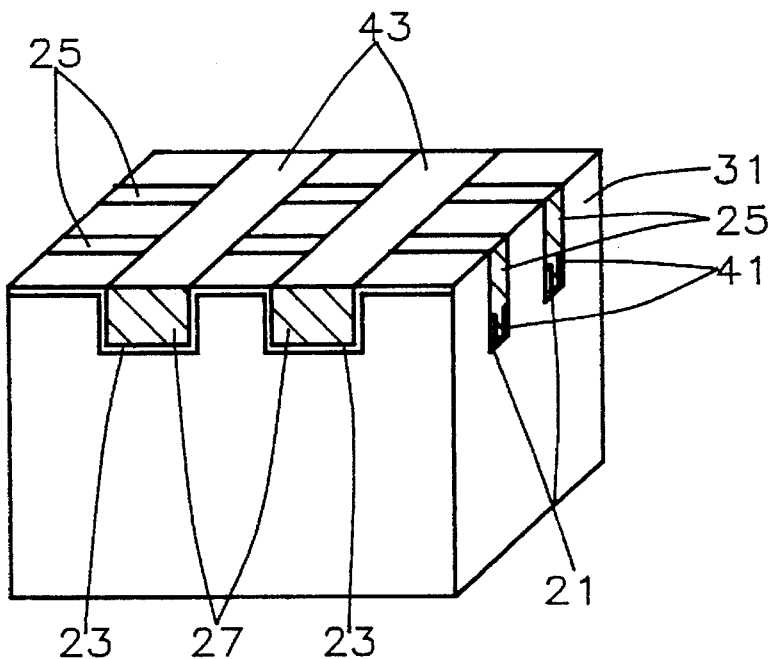
FIG. 1 is a descriptive view of the Diving Channel Device structure.
Figure 2:
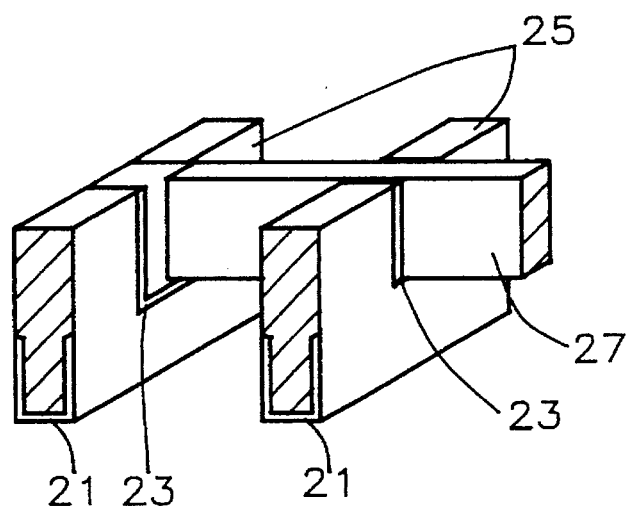
FIG. 2 is a descriptive view of the Diving Channel Device structure showing only the filled deep vertical trenches and filled shallow vertical trenches with the silicon substrate removed from the drawing.

Refer now to FIGS. 1 and 2, there is shown an embodiment of the diving channel device structure. FIG. 1 shows a descriptive view of the device structure. Deep vertical trenches 41 with deep walls and deep bottoms are formed in the silicon substrate 31. The deep vertical trenches are between about 0.1 and 1.0 microns wide and between about 0.5 and 5.0 microns deep. The minimum distance between the nearest deep walls of adjacent deep vertical trenches is about 0.2 microns. An isolation oxide layer 21 of $SiO_2$ with a thickness between about 200 Angstroms and 600 Angstroms is formed on the deep bottoms and the lower part of the deep walls of the deep vertical trenches. The deep vertical trenches 41 are filled with a first heavily doped polysilicon 25 having a doping level between about $1\times10^{18}/cm^3$ and $1\times10^{21}/cm^3$ to form the sources and drains of the field effect transistors. For an N type silicon substrate 31 P type heavily doped polysilicon 25 is used to fill the deep vertical trenches. For a P type silicon substrate 31 N type heavily doped polysilicon 25 is used to fill the deep vertical trenches.

Also as shown in FIG. 1 shallow vertical trenches 43 with shallow walls and shallow bottoms are formed in the silicon substrate 31 so as to cross the deep vertical trenches 41. The shallow vertical trenches are about 0.2 microns wide and between about 0.4 and 2.0 microns deep. The minimum distance between the nearest shallow walls of adjacent shallow vertical trenches is about 0.2 microns. A gate oxide layer 23 of $SiO_2$ with a thickness between about 50 and 200 Angstroms is formed on the shallow walls and shallow bottoms of the shallow vertical trenches 43. The shallow vertical trenches are then filled with a second heavily doped polysilicon 27 having a doping level between about $1 \times 10^{18}/cm^3$ and $1 \times 10^{21}/cm^3$ to form the gates of the field effect transistors.

FIG. 2 shows a descriptive view of the device structure with the silicon substrate removed from the drawing. The first heavily doped polysilicon 25 filling the deep vertical trenches form the source and drain of the field effect transistor. The second heavily doped polysilicon 27 filling the shallow vertical trenches form the gate of the field effect transistor. The gate oxide 23 is shown insulating the second heavily doped polysilicon 27 from the remainder of the field effect transistor. It can be seen from FIG. 2 that this structure produces a U shaped field effect transistor and that the effective channel width is two times the depth of the shallow vertical trench plus the width of the shallow vertical trench. Electrical contacts, not shown, are formed to the gates, sources, and drains. The isolation oxide 21, shown in FIG. 2, reduces the leakage current between source and drain. The large channel width helps keep effective drive current high. The deep vertical trench source and drain resistances remain nearly constant when the dimensions of the diving channel device topographical area is made smaller width increased levels of integration.

Figure 3:
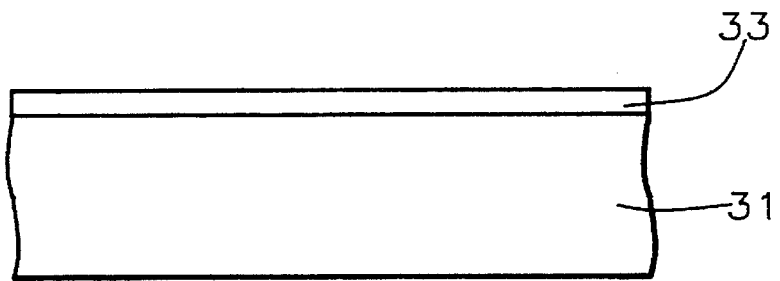
FIG. 3 is a cross sectional view of the barrier dielectric layer formed on the surface of the silicon substrate.
Figure 4:
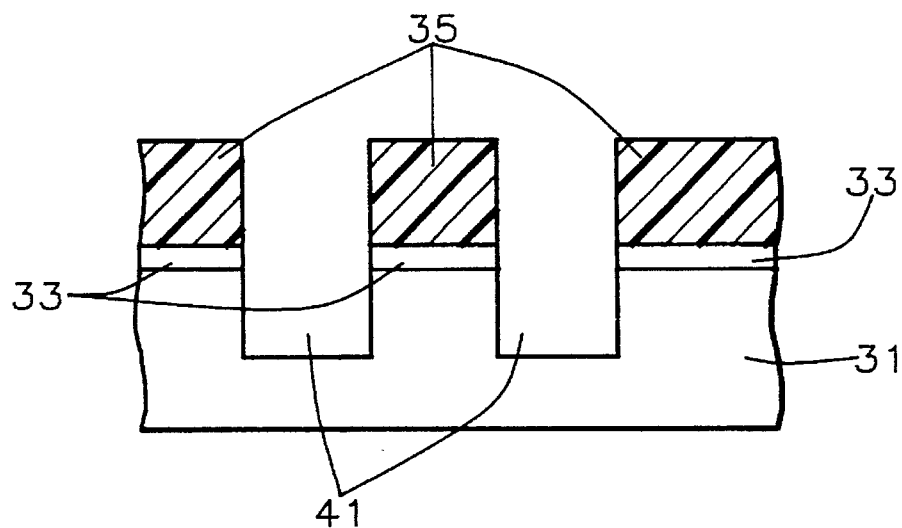
FIG. 4 is a cross sectional view of the deep vertical trenches formed in the silicon substrate through the openings in the photoresist.

Refer now to FIG. 3 through FIG. 8 and FIG. 1, there is shown an embodiment of a method of forming the high density high performance device structure. FIG. 3 shows the silicon substrate 31 with a barrier oxide 33 of $SiO_2$ with a thickness of between about 200 and 600 Angstroms. Next, as shown in FIG. 4, deep vertical trenches 41 are formed in the silicon substrate 31 through patterned openings in a photoresist 35 layer formed on the barrier oxide 33. The deep vertical trenches are formed by means of dry etching methods. The deep vertical trenches 41 are between about 0.1 and 1.0 microns wide and between about 0.5 and 5.0 microns deep. The minimum distance between the nearest deep walls of adjacent deep vertical trenches is about 0.2 microns.

Figure 5:
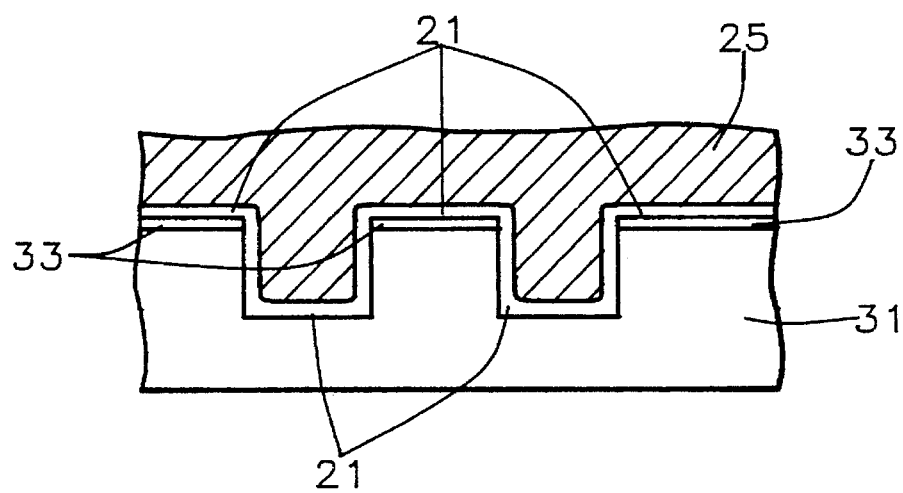
FIG. 5 is a cross sectional view of the first dielectric layer and first polysilicon material formed on the silicon substrate and in the deep vertical trenches.

As shown in FIG. 5 the photoresist is removed and an isolation oxide 21 layer of $SiO_2$ with a thickness of between about 200 and 600 Angstroms is formed on the substrate surface and the deep walls and deep bottoms of the deep vertical trenches. A first polysilicon 25 is then formed on the surface of the silicon substrate filling the deep vertical trenches.

Figure 6:
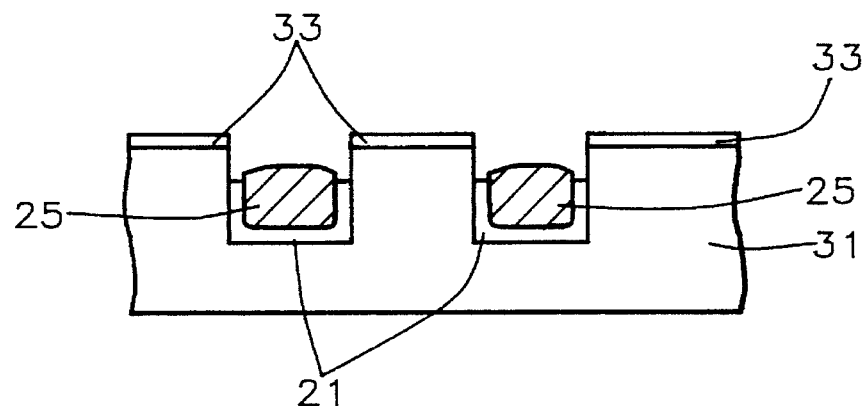
FIG. 6 is a cross sectional view of the deep vertical trenches in the silicon substrate after the first polysilicon material and the first dielectric material have been etched back.
Figure 7:
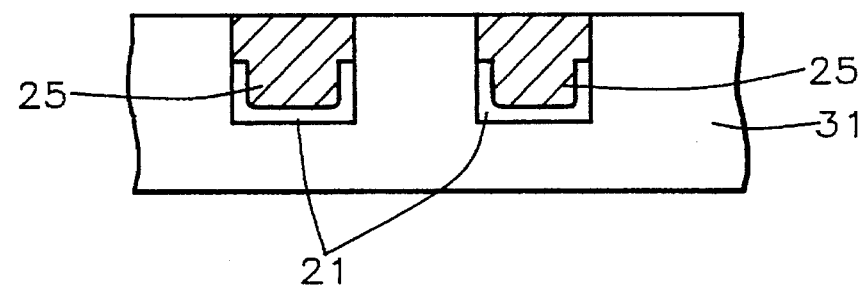
FIG. 7 is a cross sectional view of the deep vertical trenches in the silicon substrate after they have been refilled with the first polysilicon material.

As shown in FIG. 6 the first polysilicon layer 25 and the isolation layer of $SiO_2$ 21 are then etched back so that the isolation layer of $SiO_2$ 21 and the first polysilicon 25 are removed from the surface of the silicon substrate 31 and the top part of the deep walls of the deep vertical trenches. As shown in FIG. 7 the deep vertical trenches are then refilled with first polysilicon 25 and etched back to the substrate surface. The first polysilicon is then heavily doped, using doping methods such as ion implantation, to a doping level between about $1 \times 10^{18}/cm^3$ and $1 \times 10^{21}/cm^3$ and annealed to form the sources and drains of the device. For an N type substrate the doping forms a heavily doped P type polysilicon for the first polysilicon material. For a P type substrate the doping forms a heavily doped N type polysilicon for the first polysilicon material. The barrier oxide is then removed.

Figure 8:
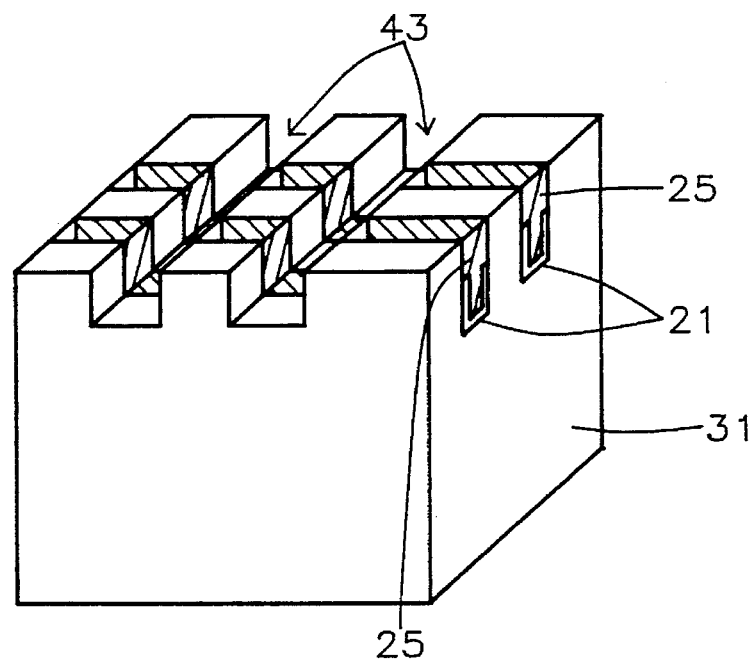
FIG. 8 is a descriptive view of the Diving Channel Device structure after the shallow vertical trenches have been formed in the silicon substrate.

As shown in FIG. 8 shallow vertical trenches 43 with shallow walls and shallow bottoms are formed in the silicon substrate 31 crossing the deep vertical trenches. As shown in FIG. 1 a gate oxide layer 23 of $SiO_2$ with a thickness between about 50 and 200 Angstroms is formed on the surface of the silicon substrate 31 and the shallow walls and shallow bottoms of the shallow vertical trenches. A second polysilicon 27 is then formed in the shallow vertical trenches and on the surface of the silicon substrate 31 and etched back to the surface of the substrate. The second polysilicon is then heavily doped, using doping methods such as ion implantation, to a doping level between about $1 \times 10^{18}/cm^3$ and $1 \times 10^{21}/cm^3$ and annealed, forming the gates of the field effect transistors. If position dependent doping levels are desired, such as for a read only memory, a position coded ion implant process can be used. Electrical contacts, not shown, are then formed to the sources, drains and gates and the device is completed.

While the invention has been particularly shown and described with reference to the preferred embodiments thereof, it will be understood by those skilled in the art that various changes in form and details may be made without departing from the spirit and scope of the invention.

What is claimed is:

1. A diving channel device, comprising:

a semiconductor substrate;

deep vertical trenches having deep walls and deep bottoms formed in said semiconductor substrate;

a first dielectric layer formed on said deep bottoms and the lower part of said deep walls of said deep vertical trenches;

a first heavily doped polysilicon material filling said deep vertical trenches;

shallow vertical trenches having shallow walls and shallow bottoms formed in said semiconductor substrate crossing said deep vertical trenches such that said shallow bottoms of said shallow vertical trenches are above the top of said first dielectric layer on said deep walls of said deep vertical trenches;

a second dielectric layer covering said shallow walls and said shallow bottoms of said shallow vertical trenches;

a second heavily doped polysilicon material filling said shallow vertical trenches; and electrical contacts formed to said first heavily doped polysilicon material and to said second heavily doped polysilicon material.

2. The diving channel device of claim 1 wherein said semiconductor substrate is P type silicon and said first polysilicon material is heavily doped N type polysilicon.

3. The diving channel device of claim 1 wherein said semiconductor substrate is N type silicon and said first polysilicon material is heavily doped P type polysilicon.

4. The diving channel device of claim 1 wherein said deep vertical trenches are between about 0.1 and 1.0 microns wide and between about 0.5 and 5.0 microns deep.

5. The diving channel device of claim 1 wherein the minimum distance between adjacent said deep walls of adjacent said deep vertical trenches is about 0.2 microns.

6. The diving channel device of claim 1 wherein said shallow vertical trenches are between about 0.4 and 2.0 microns deep.

7. The diving channel device of claim 1 wherein the minimum distance between adjacent said shallow walls of adjacent said shallow vertical trenches is about 0.2 microns.

8. The diving channel device of claim 1 wherein the minimum distance between said top of said first dielectric layer on said deep walls of said deep vertical trenches and said shallow bottoms of said shallow vertical trenches is about 0.05 microns.

9. The diving channel device of claim 1 wherein said first dielectric material is silicon dioxide with a thickness between about 200 Angstroms and 600 Angstroms.

10. The diving channel device of claim 1 wherein said second dielectric material is silicon dioxide with a thickness between about 50 and 200 Angstroms.

11. The diving channel device of claim 1 wherein a region adjacent to said shallow walls of Said shallow vertical trenches between adjacent said deep vertical trenches and a region under the shallow bottoms of said shallow vertical trenches between adjacent said deep vertical trenches form the channel region, and the second polysilicon material filling said shallow vertical trenches form the control gates of field effect transistors.

12. The diving channel device of claim 11 wherein the channel width of said field effect transistors is twice the depth of said shallow vertical trenches plus the width of said shallow vertical trenches.

13. The diving channel device of claim 11 wherein said deep vertical trenches form the sources and drains of said field effect transistors, and said first polysilicon material filling said deep vertical trenches can be replaced by other conducting material.

* * * * *